(12) United States Patent  
Salmia et al.

(10) Patent No.: US 9,712,150 B2
(45) Date of Patent: Jul. 18, 2017

(54) LIMITING OF TEMPERATURE VARIATIONS OF SEMICONDUCTOR COMPONENT

(71) Applicant: ABB Technology Oy, Helsinki (FI)

(72) Inventors: Teemu Salmia, Espoo (FI); Jukka-Peeka Kittilä, Helsinki (FI); Marko Raatikainen, Hyvinkää (FI)

(73) Assignee: ABB Technology OY (FI)

( * ) Notice: Subject to any disclaimer, the term of this patent is extended or adjusted under 35 U.S.C. 154(b) by 0 days.

(21) Appl. No.: 14/879,169

(22) Filed: Oct. 9, 2015

(65) Prior Publication Data

US 2016/0118975 A1 Apr. 28, 2016

(30) Foreign Application Priority Data

Oct. 24, 2014 (EP) .................................... 14190260

(51) Int. Cl.
*H03K 17/00* (2006.01)
*H03K 17/14* (2006.01)
*H02M 1/32* (2007.01)

(52) U.S. Cl.
CPC .............. *H03K 17/14* (2013.01); *H02M 1/32* (2013.01); *H02M 2001/327* (2013.01)

(58) Field of Classification Search
CPC ...... H03K 17/00; H03K 17/785; H03K 17/14; H03K 17/145; H03K 19/00369; H03K 19/00376; H03K 19/00384; H03K 2017/0806; G11C 11/44
USPC ......................... 327/365, 366, 369, 371, 378
See application file for complete search history.

(56) References Cited

FOREIGN PATENT DOCUMENTS

GB 2503779 A 1/2014

OTHER PUBLICATIONS

European Patent Office, European Search Report issued in European Patent Application No. 14190260.1 dated Jun. 16, 2015, 9 pp.

*Primary Examiner* — Lincoln Donovan
*Assistant Examiner* — Diana J Cheng
(74) *Attorney, Agent, or Firm* — Taft Stettinius & Hollister

(57) ABSTRACT

A method and an arrangement of limiting temperature variations in a semiconductor component of a switching converter, the method comprising determining a quantity relating to operation temperature of the switching converter, determining temperature of the semiconductor component, selecting a maximum value of switching frequency of the switching converter based on the determined quantity relating to operation temperature of the switching converter and the temperature of the semiconductor component, and limiting the switching frequency of the semiconductor component of the switching converter to the selected switching frequency.

18 Claims, 3 Drawing Sheets

LIMITING OF TEMPERATURE VARIATIONS OF SEMICONDUCTOR COMPONENT

FIELD OF THE INVENTION

The present invention relates to limiting of temperature variations of a semiconductor component, and particularly to limiting temperature variations of a switching semiconductor component in a converter device.

BACKGROUND OF THE INVENTION

Converter devices, such as frequency converters, inverters and other devices modifying electrical power using semiconductor switches, employ semiconductors that switch currents and voltages. Typical examples of a semiconductor switches used in converter applications include an insulated gate bipolar transistor (IGBT) and a diode. IGBTs are able to switch high currents and high voltages. In many applications active switches, such as IGBTs, require an antiparallel connected diode that has to withstand similar currents and voltages as the switch itself. During each switching instant power loss occurs in the switch and this dissipated power heats up the switching component. Similarly, when current is cut-off from a diode, the diode heats up due to the dissipated power. The losses also occur during the conduction of the components.

In a voltage source frequency converter, which is a device used for controlling the operation of a motor, the outputted voltage is generated using an inverter. The inverter operates by forming short voltage pulses from a DC voltage such that the output voltage from the inverter is a pulsed voltage. The length of the pulses depends on the switching frequency of the inverter. The switching frequency has an impact on the control of the motor; the higher the switching frequency is, the better control dynamics are obtained.

Since each switching of the semiconductor component dissipates power, the higher switching frequency results in more losses and the cooling arrangement of the device should be designed carefully to meet the amount of losses such that the temperature of the semiconductor component does not exceed its highest allowable temperature.

In certain applications the converter device is loaded in a cyclic manner. In such use the converter is loaded heavily for a certain period of time and after the high load the load is reduced greatly. When this change of loading is continued, the semiconductor components are stressed heavily due to the variation of temperature in the semiconductor component. In a semiconductor component the actual pn-junction of the component heats the most as the power is dissipated in chip of the semiconductor. The cycling of temperature stresses the components heavily as different parts of the physical component heat differently and therefore the component is subjected to mechanical wear and premature breakdown.

It is known to limit the switching frequency of the converter device in order to limit the temperature changes in cyclic use. As mentioned above, the reduction of switching frequency of the converter reduces the losses in the component. Therefore, in a cyclic operation, the temperature variations may be reduced by reducing the switching frequency.

FIG. 1 shows an example of a known procedure for limiting the temperature variations in which switching frequency is limited based on the temperature of semiconductor component. FIG. 1 shows the limit of the switching frequency as a function of temperature. When the temperature of the semiconductor component exceeds a first fixed limit T_sf_low, the switching frequency is reduced linearly from its maximum value SF_max. Once the temperature increases further, the switching frequency is limited until the temperature reaches the second fixed limit T_sf_high after which the switching frequency is limited to value of SF_min. Thus depending on the determined temperature of the semiconductor component, the switching frequency is selected in the above manner.

FIG. 2 shows two different scenarios in connection with the known procedure. In the examples of FIG. 2 it is assumed that the converter has been idle for a long period and a stepwise load is given to the converter. In the first case the temperature of the cooling medium is 70° C. and thus the temperature of the semiconductor is also the same. The temperature of the semiconductor starts to increase rapidly until limit T_sf_low (100° C.) is reached. After the limit the switching frequency is decreased and the temperature rises in the end to 110° C. and the temperature variation dTj is 40° C. In the second case the temperature of the cooling medium is only 20° C. Although the temperature of the semiconductor rises as in the first case, the temperature does not exceed the lower limit T_sf_low. Therefore the whole loading period is operated without limiting the switching frequency. This leads to a situation in which the temperature variation dTj is 60° C.

The temperature limits T_sf_high and T_sf_low are set in such way that they operate with highest allowable temperature of the cooling medium. Further, the difference between the temperatures has to be chosen to be quite high so that the lower limit can be reached with other temperatures of the cooling medium than the highest allowable temperature. This, however, is not that effective as the smaller the difference between the temperature limits is, the more effectively the reduction of switching frequency compensates the temperature of the semiconductor component.

As shown above, the known system leads to a situation in which large temperature variations are possible as the main concern has been in the limiting of the maximum temperature. However, the larger variations in temperature wear the component more than smaller variations in higher absolute temperature.

BRIEF DESCRIPTION OF THE INVENTION

An object of the present invention is to provide a method and an arrangement for implementing the method so as to solve the above problem. The objects of the invention are achieved by a method and an arrangement which are characterized by what is stated in the independent claims. The preferred embodiments of the invention are disclosed in the dependent claims.

The invention is based on the idea of using variable temperature limit in limiting the switching frequency. The variable limit is dependent on a quantity relating to temperature. As the limit adapts to the prevailing conditions, the temperature cycling can be limited regardless of the starting temperature.

An advantage of the method and arrangement of the invention is that the invention ensures longer lifetime for semiconductor components in a converter apparatus even when the load of the converter is highly varying. Further, the embodiments of the invention enable to limit the temperature more effectively than the known solutions. According to an embodiment, the difference between the higher and the lower temperature limit is kept smaller and thereby the temperature variations are limited effectively.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

Figure 1:
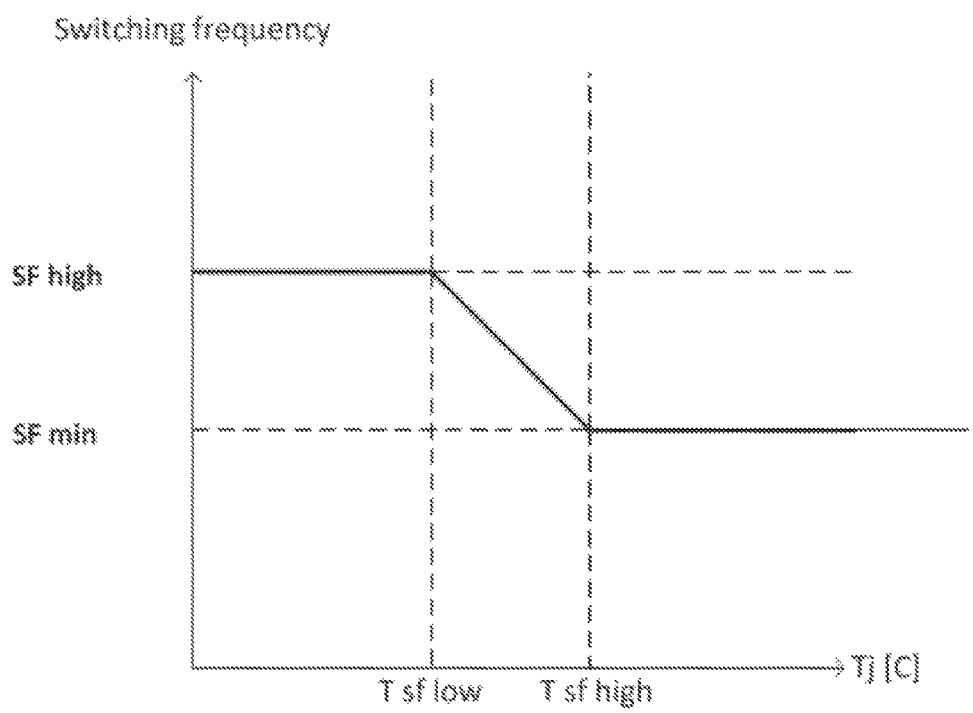
FIGS. 1 and 2 show a known temperature limiting scheme.

In the invention, a quantity relating to operation temperature of the switching converter is determined. Such quantity is, for example, temperature of the cooling medium of the switching converter, filtered temperature of the semiconductor component, information of the loading of the switching converter or time information. Further in the invention, the temperature of the semiconductor component is determined and based on the determined quantity and the temperature of the semiconductor component, a maximum value of the switching frequency is selected. The switching frequency of the semiconductor component is further limited to the selected switching frequency.

According to an embodiment, the quantity relating to operation temperature of the switching converter is the temperature of the cooling medium. The cooling medium is either a cooling liquid or cooling air. The temperature of the cooling medium is determined preferably directly by measuring the temperature of the cooling medium.

According to an embodiment of the invention, a higher temperature limit T_sf_high is set on the basis of the quantity relating to operation temperature of the switching converter. When the temperature of the semiconductor component is above the higher temperature limit, the switching frequency is limited to a second frequency value SF_min. Thus according to the embodiment, the quantity relating to the operation temperature sets the temperature limit T_sf_high. When the temperature of the switching component reaches this temperature limit, the switching frequency of the switching component is limited the second frequency value, i.e. the switching frequency of the component cannot rise above the set second frequency value so that the temperature variation of the component is reduced.

When the quantity relating to operation temperature of the switching converter is the temperature of the cooling medium T_liquid, the higher temperature limit can be calculated by adding a constant value to the temperature of the cooling medium. This constant can be selected according to the specific device and configuration. When the quantity relating to operation temperature of the switching converter is filtered temperature of the semiconductor component, the filtered temperature represents the temperature in which the semiconductor component is operating. It is known, that the temperature of the heat sink to which the switching component is attached rises based on the temperature of the switching component. Thus when the temperature of the switching component is suitably filtered by a low-pass filter, an approximation of temperature of the cooling medium is obtained. Further, a temperature model may be used which determines the temperature of the cooling medium based on the temperature of the switching component or on the information of the loading of the switching component.

Another further possibility is to use time information as a quantity relating to operation temperature of the switching converter. The time information may include time and month. In such case the average hourly or daily temperatures of the geographical location of the switching converter are used. The hourly temperature data is useful when the switching converter is located in such places where the temperature variations have an effect on the temperature of the converter, i.e. in vehicles or other such devices that are affected by the atmospheric conditions.

As mentioned, the second frequency value is set as the maximum value of the switching frequency and the switching frequency of the converter is limited by the second frequency value when the temperature of the component is higher than the higher temperature limit T_sf_high. When the temperature of the switching component is lower than the higher temperature limit, the maximum value of the switching frequency is limited as a function of the temperature of the switching component. Such function may be a linear function giving the maximum value as a function of the temperature of the component such that the maximum limit is linearly increased when the temperature of the component increases. The linear function is an example, and the function may have any form as long as the increased temperature of the component decreases the maximum value of the switching frequency at least in some temperature range.

According to an embodiment, a lower temperature limit T_sf_low is set on the basis of the quantity relating to the operation temperature of the switching converter. In the following, the quantity relating to the operation temperature is referred to as determined temperature of the cooling medium T_liquid. However, the invention or the embodiments are not restricted to this specific embodiment, as the temperature of the cooling medium is used for merely to simplify the following examples.

The lower temperature limit may be set by calculating T_sf_low=T_liquid+X1, in which T_liquid is the determined temperature of the cooling medium and X1 is a temperature value that is selected according to the specific device and configuration.

Further, according to the embodiment and as already mentioned, a higher temperature limit T_sf_high is set based on the determined temperature of the cooling medium. The higher temperature limit can be set, for example by calculating T_sf_high=T_sf_low+X2, in which X2 is the desired temperature difference between the lower temperature limit and the higher temperature limit and it can be selected based on the specific device and configuration. The calculation of T_sf_high with the above formula equals to T_sf_high=T_liquid+X1+X2. As both X1 and X2 are positive values, the lower temperature limit has a lower value than the higher temperature limit.

As mentioned above, the temperature of the semiconductor component is determined in the method. The relevant temperature with respect to the over temperature protection is the temperature of the silicon chip Tj, i.e. the pn-junction of the semiconductor switch. As the temperature cycles wear the component due to differing temperature coefficients between the parts of the component, the temperature Tc in the bottom of the physical switch component i.e. temperature of the case and the mentioned temperature of the junction Tj are of interest. The case temperature Tc is between the temperature of the junction Tj and the temperature of the cooling medium. Thus when the variation of the junction temperature is reduced with respect to temperature of the cooling medium, also the difference between junction and case temperatures is reduced.

According to an embodiment, the temperature of the semiconductor component that is determined is the temperature of the pn-junction of the semiconductor component. Some semiconductor components or modules comprising multiple of components include temperature measurement. This measurement is made from a known point of the component. From this temperature it is possible to calculate the temperature of the pn-junction of the component using a thermal model made from the component. A thermal model is basically a simulation model which is formed of thermal properties of the component and in which power losses and one or more known temperatures are inputs in a known manner. When power losses and the known temperature are inputted, the thermal model calculates the temperature in the desired point. The power losses of the component are known when current and voltage that are switched are known.

According to an embodiment, when the determined temperature of the semiconductor component is below the lower temperature limit T_sf_low the maximum value of the switching frequency has a first frequency value SF_high. Further, when the temperature of the semiconductor component is above the higher temperature limit T_sf_high the maximum value of the switching frequency has a second frequency value SF_min. The second frequency value is lower than the first frequency value and the lower temperature limit is lower than the higher temperature limit. When the temperature of semiconductor component, and more specifically the temperature of the pn-junction of the semiconductor component is below the lower temperature limit T_sf_low, the used switching frequency is typically limited to the highest allowable switching frequency. This means a switching frequency that is used when no limitations are applied.

When the temperature of the semiconductor is, on the other hand, above the higher temperature limit T_sf_high, the switching frequency is limited to the second frequency value SF_min. This limitation limits the maximum switching frequency to the lowest possible frequency that is applicable such that the operation of the converter device is still reliable in view of control needs.

When the temperature of the semiconductor component is between the lower temperature limit T_sf_low and higher temperature limit T_sf_high the maximum value of the switching frequency has a value between the first frequency value and second frequency value. The maximum value of the switching frequency changes preferably linearly depending on the determined temperature once the temperature is between the mentioned limits. When between the limits, the value for the switching frequency SF can be calculated with $$SF = \left(\frac{SF\_min - SF\_high}{T\_sf\_high - T\_sf\_low}\right)(Tj - T\_sf\_low) + SF\_high$$

in which the determined semiconductor temperature is Tj.

The switching frequency limitation procedure outputs a frequency limit value to the modulator or similar device that is responsible for producing the switching instructions to the switches.

When the maximum limit for the switching frequency is determined in the above identified manner, the semiconductor component of the switching converter is operated using the maximum value of switching frequency based on the temperature of the semiconductor component and the quantity relating to the operation temperature of the switching converter.

Figure 2:
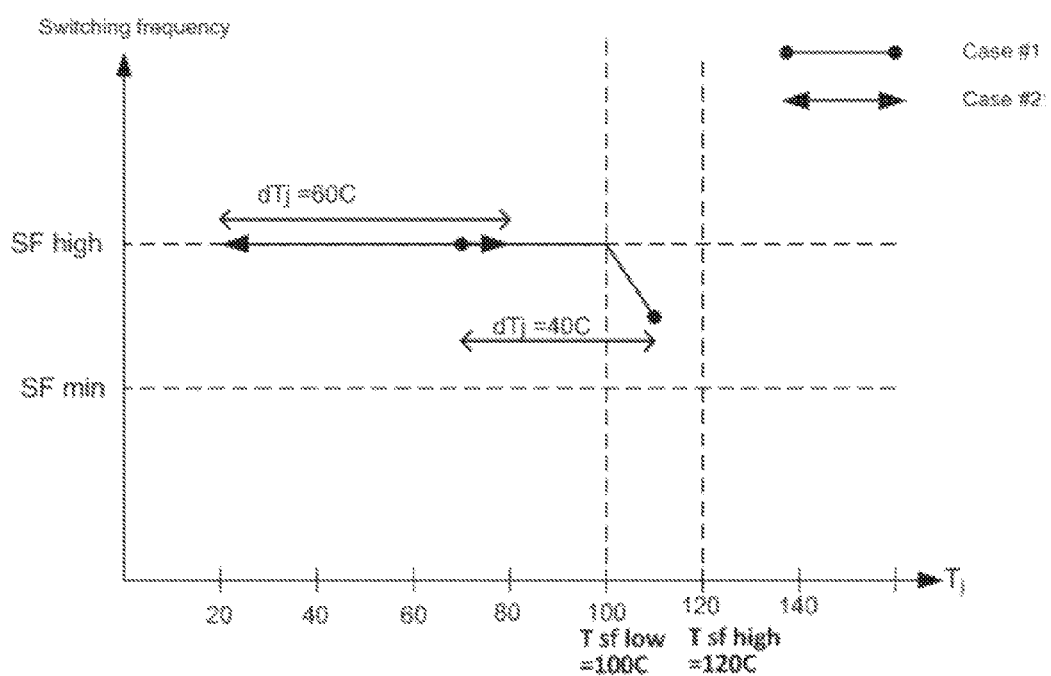
Figure 3:
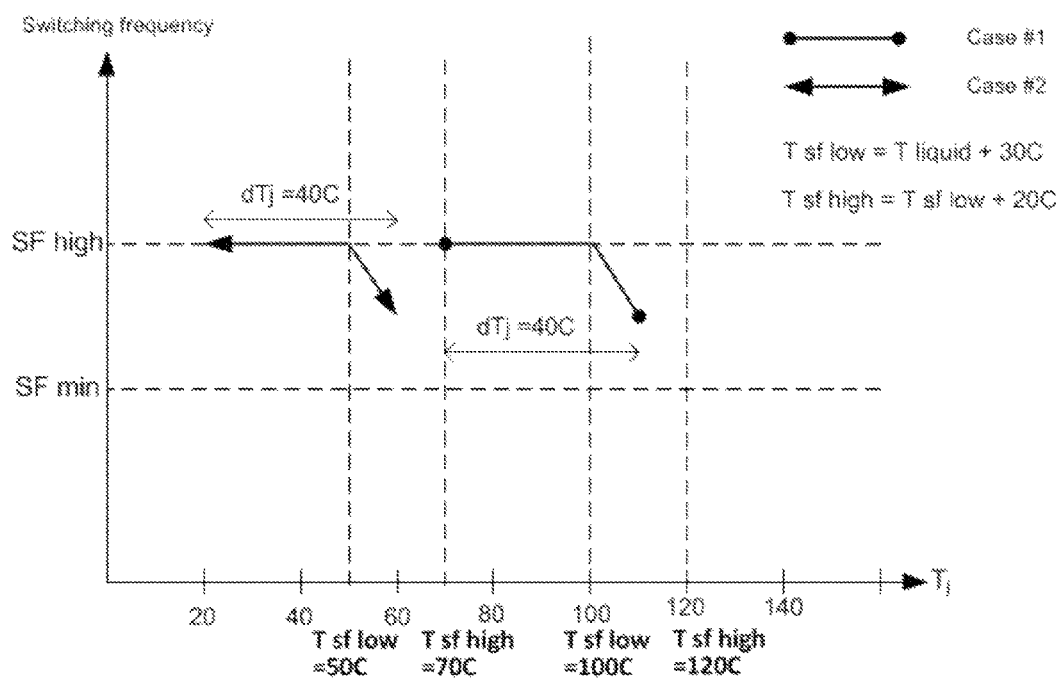
FIG. 3 illustrates an embodiment of the method of the present invention.

FIG. 3 shows similar scenarios in connection with the method of the invention as FIG. 2, thus the converter has been idle and the converter is loaded in stepwise manner.

In the example of FIG. 3 it is further defined that the lower temperature limit is 30° C. higher than the temperature of the cooling medium (liquid) and that the difference between the higher and lower temperature limits is 20° C.

In the first case of FIG. 3 the temperature of the cooling liquid is 70° C., and thus the lower temperature limit is 100° C. and the higher temperature limit is 120° C. These limit values correspond to that of FIG. 2, and thus the operation is as described in connection with FIG. 2.

In the second case, however, the use of the invention enables to limit the temperature variation as shown in FIG. 3. In the second case, the temperature of the cooling liquid is 20° C., and the lower temperature limit sets to 50° C. and the higher temperature limit to 70° C. As the temperature now rises above the lower temperature limit, the switching frequency is limited as shown in the schematic drawing. The limitation of the switching frequency according to the invention results in the reduced temperature variation even with low temperatures of the cooling medium. The reduced temperature variation is crucial in many applications. For example in traction applications the temperature of the cooling medium may vary from −40° C. to 70° C.

The presented drawings are provided only for better understanding the invention. The frequency limit curves are approximated curves that do not take account the changes in the power losses of the semiconductor component due to temperature changes or due to changes in resistivity.

The arrangement for limiting temperature variations in a semiconductor component of a switching converter of the present invention comprises means for determining a quantity relating to operation temperature of the switching converter. As mentioned above, such quantity relating operation temperature may be temperature of the cooling medium of the switching converter, filtered temperature of the semiconductor component, information of the loading of the switching converter or time information. When the quantity is temperature of the cooling medium, such means for determining the temperature are preferably temperature measurement means. The temperature may be determined using any known measurement or determination system.

As mentioned above, the filtered temperature of the semiconductor device is preferably a low-pass filtered value or modelled value, and thereby suitable means for determining such a value include arithmetic means, such as a processor programmed to carry out such filtering or modelling. Further, when the quantity relating to operation temperature is time information, the means for determining the temperature comprise a real-time clock, a calendar and a database comprising temperature values relating to the operation temperature. The database is readable by a processor and indexed according to time, date and month, for example.

Further, the arrangement comprises means for determining temperature of the semiconductor component. As presented in connection with the method, the temperature of the semiconductor component is determined preferably using a thermal model made from the semiconductor component. The thermal model is a employed in a calculation process which outputs the temperature value.

The arrangement comprises also means for selecting a maximum value of switching frequency of the switching converter based on the determined quantity relating to operation temperature of the switching converter and the temperature of the semiconductor component. Such means are preferably implemented using a processor to which the determined quantity and the determined temperature are inputted. The processor or similar calculation device calculates the maximum value of the switching frequency.

Further, the arrangement comprises means for limiting the switching frequency of the semiconductor component of the switching converter to the selected switching frequency. The means for limiting the switching frequency are preferably incorporated in a modulator of the switching converter. The modulator takes account the switching frequency limit. The limit value is inputted to the modulator so that the modulator is able to limit the switching frequency in the desired manner.

Most of the above features and means can be implemented using software that provides the calculations and comparisons, and receive required temperature measurements.

The switching converter of the invention is preferably a frequency converter. Frequency converters are used in processes requiring high torque and low torque is repeated sequences. Multiple semiconductor components are employed in a frequency converter. The temperatures of each of the components are determined and the highest temperature is decisive in limiting the switching frequency. Typically multiple semiconductor switches are operated with the same switching frequency. For example, in a three-phase frequency converter six semiconductor components are operated with the same frequency. The frequency limit is determined using the temperature of the semiconductor component having the highest temperature, and this limit is applicable to all the semiconductors that are part of a same converter device. In another alternative according to the present invention, the switching frequency of each semiconductor component is limited separately.

It will be obvious to a person skilled in the art that, as the technology advances, the inventive concept can be implemented in various ways. The invention and its embodiments are not limited to the examples described above but may vary within the scope of the claims.

The invention claimed is:

1. A method of limiting temperature variations in a semiconductor component of a switching converter, the method comprising
   determining a quantity relating to operation temperature of the switching converter,
   determining temperature of the semiconductor component,
   selecting a maximum value of switching frequency of the switching converter based on the determined quantity relating to operation temperature of the switching converter and the temperature of the semiconductor component, and
   limiting the switching frequency of the semiconductor component of the switching converter to the selected switching frequency,
   wherein the selecting of the maximum value of switching frequency comprises
   setting a higher temperature limit ($T\_sf\_high$) on the basis of the determined quantity relating to the operation temperature of the switching converter,
   selecting a maximum value of the switching frequency such that
      when the temperature of the semiconductor component is above the higher temperature limit the maximum value of the switching frequency has a second frequency value and
      when the temperature of the semiconductor component is lower than the higher temperature limit, the maximum value of the switching frequency has a higher value than the second frequency value.

2. A method according to claim 1, wherein the method also comprises setting a lower temperature limit on the basis of the determined quantity relating to temperature, and the selecting of the maximum value for the switching frequency comprises steps
   when the temperature of the semiconductor component is below the lower temperature limit the maximum value of the switching frequency has a first frequency value, and
   when the temperature of the semiconductor component is between the lower temperature limit and higher temperature limit the maximum value of the switching frequency has a value between the first frequency value and the second frequency value.

3. A method according to claim 2, wherein when the temperature of the semiconductor component is between the lower temperature limit and the higher temperature limit, the maximum value of switching frequency is changed as a function of temperature of the semiconductor component, preferably linearly depending on the temperature of the semiconductor component.

4. A method according to claim 3, wherein the method further comprises
   providing the maximum value of the switching frequency to a modulator of the switching converter, the modulator of the switching converter limiting the switching frequency to the selected maximum value.

5. A method according to claim 2, wherein when the temperature of the semiconductor component is between the lower temperature limit and the higher temperature limit, the maximum value of switching frequency is changed as a function of temperature of the semiconductor component.

6. A method according to claim 2, wherein the method further comprises
   providing the maximum value of the switching frequency to a modulator of the switching converter, the modulator of the switching converter limiting the switching frequency to the selected maximum value.

7. A method according to claim 1, wherein the method further comprises
   providing the maximum value of the switching frequency to a modulator of the switching converter, the modulator of the switching converter limiting the switching frequency to the selected maximum value.

8. A method according to claim 1, wherein the method comprises
   determining temperatures of multiple of semiconductor components,
   selecting the highest temperature of the determined temperatures,
   using the selected temperature in selecting the maximum value of the switching frequency, and
   operating the multiple of semiconductor components of the switching converter using the maximum value of the switching frequency in the multiple of semiconductor components.

9. A method according to claim 1, wherein the temperature of the semiconductor component is the temperature of the pn-junction of the component.

10. A method according to claim 9, wherein the temperature of the pn-junction of the component is determined using a thermal model of the component and a measured temperature of the component.

11. A method according to claim 1, wherein the switching converter is a frequency converter.

12. A method according to claim 1, wherein the quantity relating to operation temperature is the temperature of the cooling medium of the switching converter, filtered temperature of the semiconductor component, information of the loading of the switching converter or time information.

13. A method according to claim 12, wherein the cooling medium is cooling liquid or cooling air.

14. A method according to claim 1, wherein the method also comprises setting a lower temperature limit, and wherein when the temperature of the semiconductor component is between the lower temperature limit and the higher temperature limit, the maximum value of switching frequency is changed as a function of temperature of the semiconductor component, preferably linearly depending on the temperature of the semiconductor component.

15. A method according to claim 1, wherein the method further comprises
providing the maximum value of the switching frequency to a modulator of the switching converter, the modulator of the switching converter limiting the switching frequency to the selected maximum value.

16. A method according to claim 1, wherein the method comprises
determining temperatures of multiple of semiconductor components,
selecting the highest temperature of the determined temperatures,
using the selected temperature in selecting the maximum value of the switching frequency, and
operating the multiple of semiconductor components of the switching converter using the maximum value of the switching frequency in the multiple of semiconductor components.

17. A method according to claim 1, wherein the temperature of the semiconductor component is the temperature of the pn-junction of the component.

18. An arrangement of limiting temperature variations in a semiconductor component of a switching converter, the arrangement comprising
means for determining a quantity relating to operation temperature of the switching converter,
means for determining temperature of the semiconductor component,
means for selecting a maximum value of switching frequency of the switching converter based on the determined quantity relating to operation temperature of the switching converter and the temperature of the semiconductor component, and
means for limiting the switching frequency of the semiconductor component of the switching converter to the selected switching frequency,
wherein the means for selecting the maximum value of switching frequency performs the steps of:
setting a higher temperature limit (T_sf_high) on the basis of the determined quantity relating to the operation temperature of the switching converter,
selecting a maximum value of the switching frequency such that
when the temperature of the semiconductor component is above the higher temperature limit the maximum value of the switching frequency has a second frequency value and
when the temperature of the semiconductor component is lower than the higher temperature limit, the maximum value of the switching frequency has a higher value than the second frequency value.

* * * * *